United States Patent
Xu

(10) Patent No.: US 9,770,758 B2
(45) Date of Patent: *Sep. 26, 2017

(54) METHOD FOR FORMING A DIRECTIONALLY SOLIDIFIED REPLACEMENT BODY FOR A COMPONENT USING ADDITIVE MANUFACTURING

(71) Applicant: United Technologies Corporation, Farmington, CT (US)

(72) Inventor: JinQuan Xu, East Greenwich, RI (US)

(73) Assignee: United Technologies Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/219,921

(22) Filed: Jul. 26, 2016

(65) Prior Publication Data

US 2017/0144219 A1    May 25, 2017

Related U.S. Application Data

(63) Continuation of application No. 14/706,685, filed on May 7, 2015, now Pat. No. 9,452,474.

(Continued)

(51) Int. Cl.

| | |
|---|---|
| *B22D 23/06* | (2006.01) |
| *B22D 27/04* | (2006.01) |
| *B33Y 10/00* | (2015.01) |
| *B33Y 40/00* | (2015.01) |
| *B33Y 80/00* | (2015.01) |

(Continued)

(52) U.S. Cl.
CPC ............ *B22D 27/045* (2013.01); *B22C 9/108* (2013.01); *B22C 9/22* (2013.01); *B22D 25/02* (2013.01); *B22D 29/001* (2013.01); *B22F 3/1055* (2013.01); *B22F 3/24* (2013.01); *B22F 5/04* (2013.01); *B23K 15/0086* (2013.01); *B23K 26/342* (2015.10); *B23K 26/70* (2015.10); *B23K 37/00* (2013.01); *B33Y 10/00* (2014.12); *B33Y 40/00* (2014.12); *B33Y 80/00* (2014.12); *F01D 5/005* (2013.01); *F01D 5/12* (2013.01); *F01D 9/04* (2013.01); *F02C 7/222* (2013.01); *F23R 3/002* (2013.01); *B22F 2003/248* (2013.01); *B22F 2998/10* (2013.01); *B23K 2201/001* (2013.01); *F05D 2220/32* (2013.01);

(Continued)

(58) Field of Classification Search
CPC .... B22C 7/02; B22C 9/02; B22C 9/04; B22C 9/043; B22D 23/06
USPC .................... 164/9, 24, 34, 35, 80, 516–529
See application file for complete search history.

(56) References Cited

U.S. PATENT DOCUMENTS

| | | | |
|---|---|---|---|
| 4,574,451 A | 3/1986 | Smashey et al. | |
| 5,743,322 A | 4/1998 | Jackson et al. | |

(Continued)

FOREIGN PATENT DOCUMENTS

| | | |
|---|---|---|
| EP | 2359959 | 8/2011 |
| FR | 2978070 | 1/2013 |

*Primary Examiner* — Kevin E Yoon
(74) *Attorney, Agent, or Firm* — O'Shea Getz P.C.

(57) ABSTRACT

A method of manufacturing a replacement body for a component is provided. The method includes the steps of: a) additively manufacturing a crucible for casting of the replacement body; b) solidifying a metal material within the crucible to form a directionally solidified microstructure within the replacement body; and c) removing the crucible to reveal the directionally solidified replacement body.

20 Claims, 14 Drawing Sheets

Related U.S. Application Data

(60) Provisional application No. 61/991,097, filed on May 9, 2014.

(51) Int. Cl.
| | | |
|---|---|---|
| *B22C 9/10* | (2006.01) | |
| *B22C 9/22* | (2006.01) | |
| *B22D 29/00* | (2006.01) | |
| *B22D 25/02* | (2006.01) | |
| *B22F 3/105* | (2006.01) | |
| *B22F 3/24* | (2006.01) | |
| *B22F 5/04* | (2006.01) | |
| *B23K 15/00* | (2006.01) | |
| *B23K 26/342* | (2014.01) | |
| *B23K 26/70* | (2014.01) | |
| *B23K 37/00* | (2006.01) | |
| *F01D 5/00* | (2006.01) | |
| *F01D 5/12* | (2006.01) | |
| *F01D 9/04* | (2006.01) | |
| *F02C 7/22* | (2006.01) | |
| *F23R 3/00* | (2006.01) | |
| *B23K 101/00* | (2006.01) | |

(52) U.S. Cl.
CPC .... *F05D 2230/80* (2013.01); *F05D 2300/175* (2013.01); *F05D 2300/20* (2013.01)

(56) References Cited

U.S. PATENT DOCUMENTS

| | | |
|---|---|---|
| 5,868,194 A | 2/1999 | Horwood |
| 7,413,001 B2 | 8/2008 | Wang et al. |
| 9,364,888 B2 * | 6/2016 | McBrien .................. F01D 5/28 |
| 9,415,438 B2 * | 8/2016 | McBrien .................. F01D 5/28 |
| 9,435,211 B2 * | 9/2016 | Xu ............................ F01D 5/18 |
| 2012/0222306 A1 | 9/2012 | Mittendorf et al. |
| 2013/0280091 A1 | 10/2013 | Propheter-Hinckley et al. |
| 2014/0314581 A1 | 10/2014 | McBrien et al. |
| 2015/0322799 A1 | 11/2015 | Xu |

\* cited by examiner

METHOD FOR FORMING A DIRECTIONALLY SOLIDIFIED REPLACEMENT BODY FOR A COMPONENT USING ADDITIVE MANUFACTURING

This application is a continuation of U.S. patent application Ser. No. 14/706,685 filed May 7, 2015, which claims priority to U.S. Patent Appln. No. 61/991,097 filed May 9, 2014.

BACKGROUND OF THE INVENTION

1. Technical Field

The present disclosure relates to components for a gas turbine engine and, more particularly, to the additive manufacture thereof.

2. Background Information

Gas turbine engines typically include a compressor section to pressurize airflow, a combustor section to burn a hydrocarbon fuel in the presence of the pressurized air, and a turbine section to extract energy from the resultant combustion gases.

In the gas turbine industry, methods for fabricating components with internal passageways, such as blades and vanes within the turbine section, using additive manufacturing invite much attention. Since a component is produced in a continuous process in an additive manufacturing operation, features associated with conventional manufacturing processes such as machining, forging, welding, casting, etc. can be eliminated leading to savings in cost, material, and time.

An inherent feature of metallic components fabricated by additive manufacturing is that the metallic material forming the component has a polycrystalline microstructure. However, for numerous types of turbine components it is preferable to use a metallic material having a single crystal, or a columnar grain microstructure, which microstructure is able to withstand the higher temperatures and stresses typically experienced in the operating environment in a hot gas stream.

SUMMARY

According to an aspect of the present disclosure, a method of manufacturing a replacement body for a component is provided. The method includes the steps of: a) additively manufacturing a crucible for casting of the replacement body; b) solidifying a metal material within the crucible to form a directionally solidified microstructure within the replacement body; and c) removing the crucible to reveal the directionally solidified replacement body.

In a further embodiment of the present disclosure, the step of solidifying the metal material includes directionally solidifying the material to have a single crystal microstructure.

In a further embodiment of the present disclosure, the step of solidifying the metal material includes directionally solidifying the material to have a columnar grain microstructure.

In a further embodiment of any of the foregoing embodiments of the present disclosure, the metal material may include a nickel based superalloy, cobalt based superalloy, iron based superalloy, and mixtures thereof.

In a further embodiment of any of the foregoing embodiments of the present disclosure, the crucible is additively manufactured of at least one of a ceramic material or a refractory metal material.

A further embodiment of any of the foregoing embodiments of the present disclosure includes the step of adding the metal material in powder form to the crucible.

In a further embodiment of any of the foregoing embodiments of the present disclosure, the crucible includes a core at least partially within a shell, and the core at least partially defines at least one internal passageway within the replacement body.

A further embodiment of any of the foregoing embodiments of the present disclosure includes forming the core via additive manufacturing.

A further embodiment of any of the foregoing embodiments of the present disclosure includes forming the shell via additive manufacturing.

According to another aspect of the present invention, a method of manufacturing a replacement body for a component is provided. The method includes the steps of: a) additively manufacturing the replacement body with a metal material; b) additively manufacturing a core at least partially within the replacement body; c) at least partially encasing the replacement body and the core within a shell; d) melting the additively manufactured replacement body; e) solidifying the metal material of the additively manufactured replacement body to form a directionally solidified microstructure within the component; and f) removing the shell and the core to reveal the directionally solidified microstructure replacement body.

In a further embodiment of any of the foregoing embodiments of the present disclosure, the step of solidifying the metal material includes directionally solidifying the material to have a single crystal microstructure.

In a further embodiment of any of the foregoing embodiments of the present disclosure, the step of solidifying the metal material includes directionally solidifying the material to have a columnar grain microstructure.

In a further embodiment of any of the foregoing embodiments of the present disclosure, the metal material is a powder.

In a further embodiment of any of the foregoing embodiments of the present disclosure, the core at least partially defines at least one internal passageway within the replacement body.

A further embodiment of any of the foregoing embodiments of the present disclosure includes the step of concurrently additively manufacturing the replacement body and the core within the replacement body.

In a further embodiment of any of the foregoing embodiments of the present disclosure, the core at least partially defines at least one microchannel within the replacement body.

In a further embodiment of any of the foregoing embodiments of the present disclosure, the microchannel is additively manufactured of a refractory material and the internal passageway is additively manufactured of a ceramic material.

In a further embodiment of any of the foregoing embodiments of the present disclosure, the additive manufacturing is performed by a multi-powder bed system.

A further embodiment of any of the foregoing embodiments of the present disclosure includes the step of applying a wax material at least partially onto the replacement body.

According to another aspect of the present disclosure, a method for repairing a component is provided that includes the steps of: a) identifying a target section of the component; b) removing the target section from the component, thereby creating a void in the component; c) additively manufacturing a crucible for casting of a replacement body; d) solidifying a metal material within the crucible to form a directionally solidified microstructure within the replacement body; e) removing the crucible to reveal the directionally solidified replacement body; and f) bonding the replacement body into the void within the component.

In a further embodiment of any of the foregoing embodiments of the present disclosure, the step of solidifying the metal material includes directionally solidifying the material to have a single crystal microstructure.

In a further embodiment of any of the foregoing embodiments of the present disclosure, the step of solidifying the metal material includes directionally solidifying the material to have a columnar grain microstructure.

In a further embodiment of any of the foregoing embodiments of the present disclosure, the step of bonding includes laser welding, Gas tungsten arc welding (GTAW), Electron beam welding (EBW), soldering, transition liquid phase bonding and combinations thereof.

According to another aspect of the present disclosure, a component for a gas turbine engine is provided. The component includes a metal single crystal material microstructure and a replacement body bonded into the component. The replacement body is additively manufactured, and solidified to have a directionally solidified microstructure the same as the microstructure of the component.

In a further embodiment of any of the foregoing embodiments of the present disclosure, the replacement body has a metal single crystal microstructure.

In a further embodiment of any of the foregoing embodiments of the present disclosure, the replacement body has a metal columnar grain microstructure.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
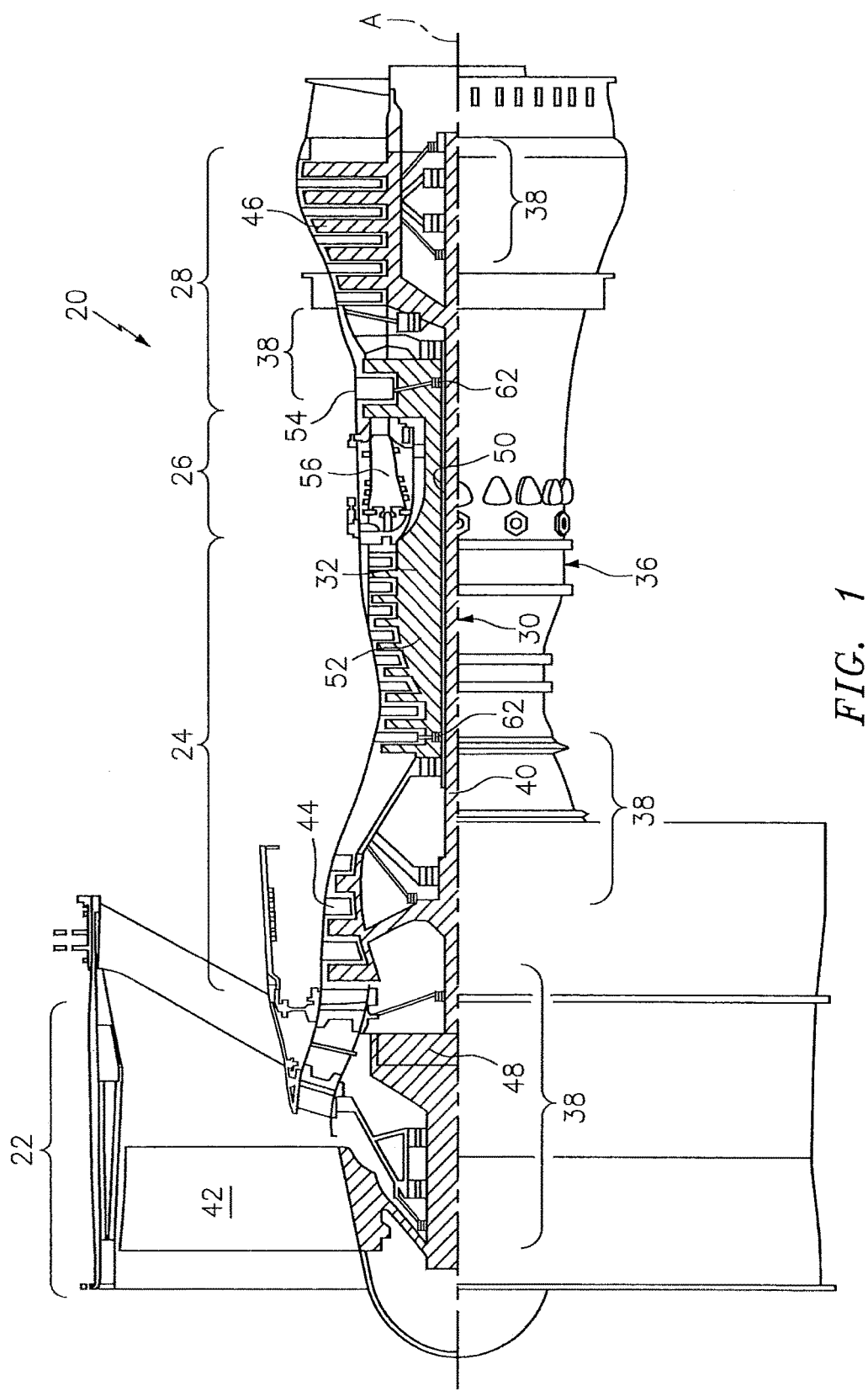
FIG. 1 is a diagrammatic cross-section of an example of gas turbine engine architecture.
Figure 2:
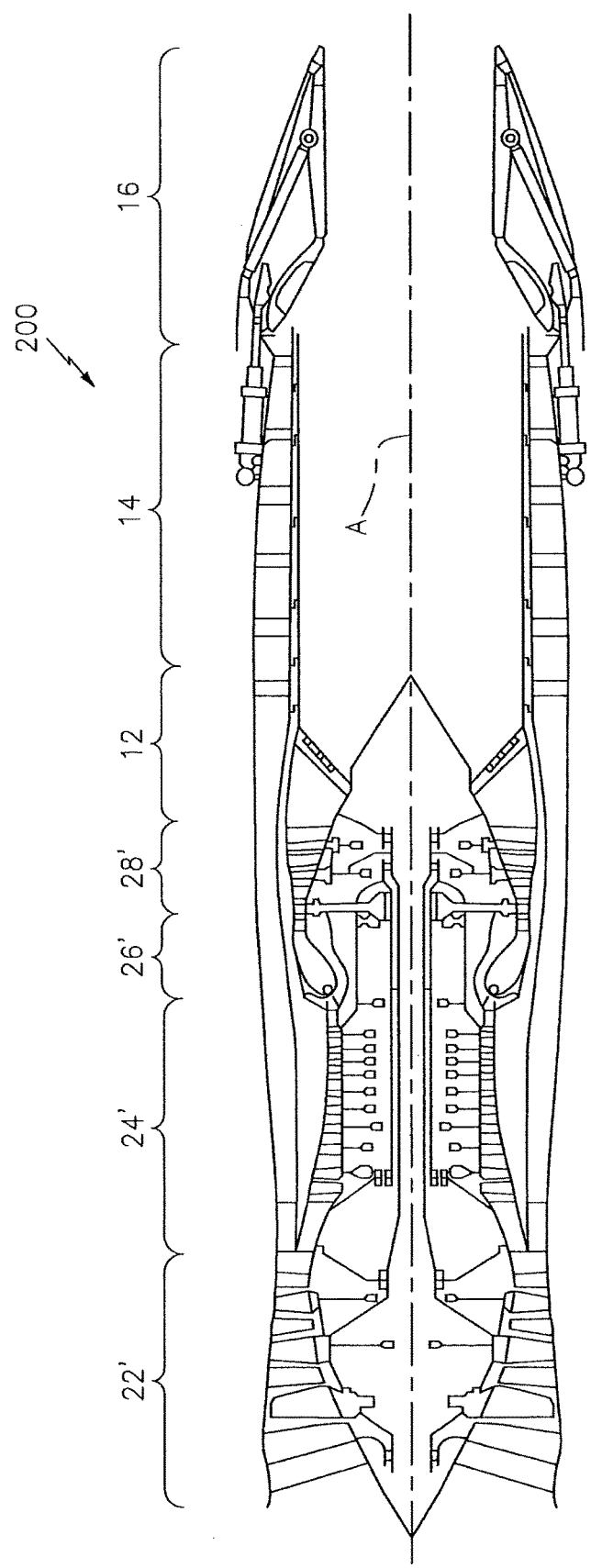
FIG. 2 is a diagrammatic cross-section of another example of gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. Alternative engine architectures 200 might include an augmentor section 12, an exhaust duct section 14 and a nozzle section 16 (FIG. 2) among other systems or features. The fan section 22 drives air along both a bypass flowpath and into the compressor section 24. The compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis X relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 drives the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis "A" which is collinear with their longitudinal axes.

Core airflow is compressed by the LPC 44 then the HPC 52, mixed with the fuel and burned in the combustor 56, then expanded over the HPT 54 and the LPT 46. The turbines 54, 46 rotationally drive the respective low spool 30 and high spool 32 in response to the expansion. The main engine shafts 40, 50 are supported at a plurality of points by bearing structures 38 within the static structure 36. Bearing structures 38 at various locations may alternatively or additionally be provided.

Figure 3:
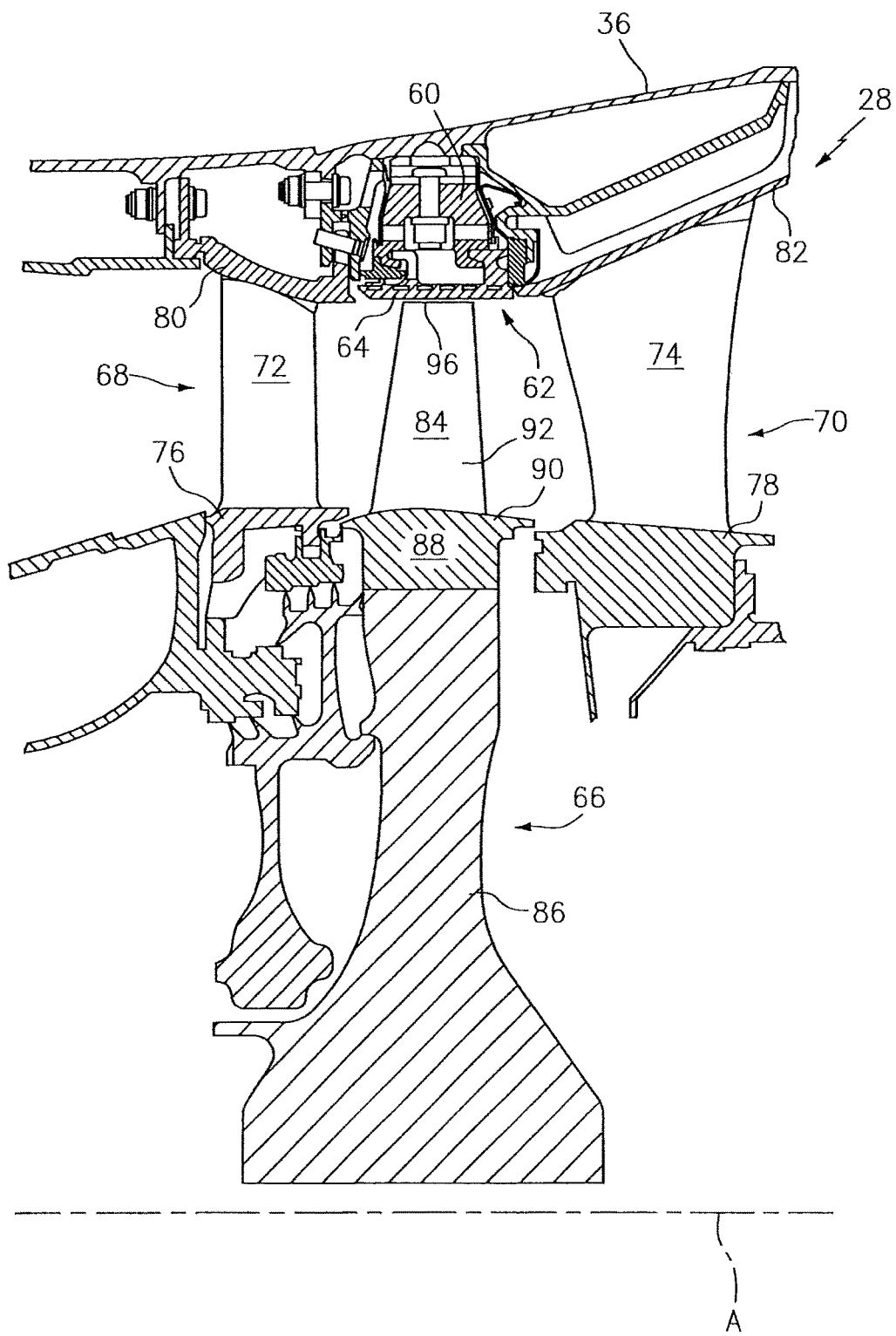
FIG. 3 is an enlarged diagrammatic cross-section of an engine turbine section.

With reference to FIG. 3, an enlarged schematic view of a portion of the turbine section 28 is shown by way of example; however, other engine sections will also benefit here from. A full ring shroud assembly 60 within the engine case structure 36 supports a blade outer air seal (BOAS) assembly 62 with a multiple of BOAS segments 64 proximate to a rotor assembly 66 (one schematically shown).

The full ring shroud assembly 60 and the blade outer air seal (BOAS) assembly 62 are axially disposed between a forward stationary vane ring 68 and an aft stationary vane ring 70. Each vane ring 68, 70 includes an array of vanes 72, 74 that extend between a respective inner vane support 76, 78 and an outer vane support 80, 82. The outer vane supports 80, 82 are attached to the engine case structure 36.

Figure 4:
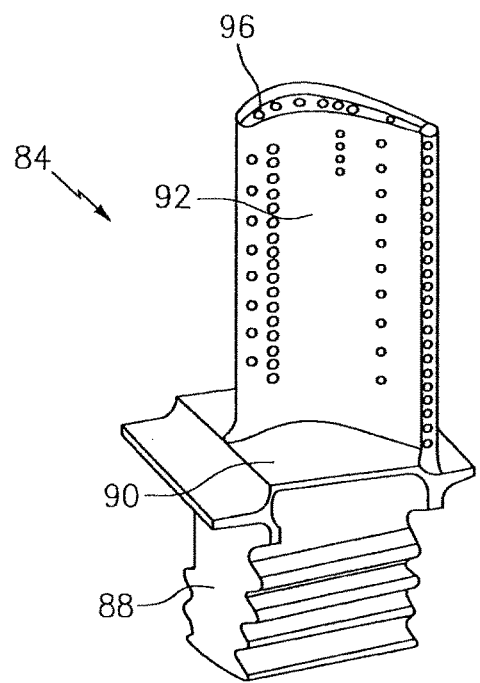
FIG. 4 is a perspective view of a turbine blade as an example component with internal passages.

The rotor assembly 66 includes an array of blades 84 circumferentially disposed around a disk 86. Each blade 84 includes a root 88, a platform 90 and an airfoil 92 (also shown in FIG. 4). A portion of each blade root 88 is received within a rim 94 of the disk 86. Each airfoil 92 extends radially outward, and has a tip 96 disposed in close proximity to a blade outer air seal (BOAS) assembly 62. Each BOAS segment 64 may include an abradable material to accommodate potential interaction with the rotating blade tips 96.

Figure 5:
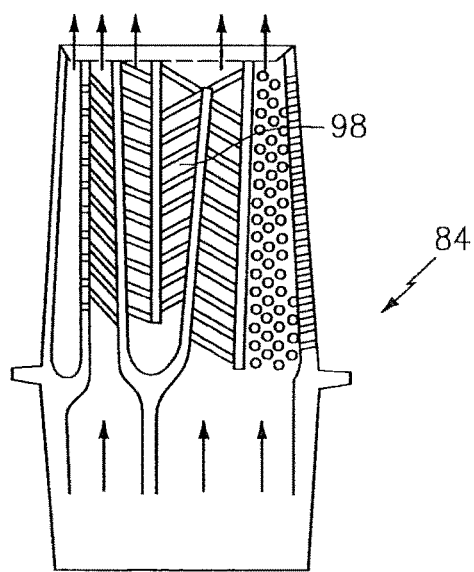
FIG. 5 is a diagrammatic cross-section view of a turbine blade showing internal passages.

To resist the high temperature stress environment in the hot gas path of a turbine engine, each blade 84 may be formed to have a single crystal microstructure. It should be appreciated that although a blade 84 with internal passageways 98 (FIG. 5) will be described and illustrated in detail, other components including, but not limited to, vanes, fuel nozzles, airflow swirlers, combustor liners, turbine shrouds, vane endwalls, airfoil edges and other gas turbine engine components "W" may also be manufactured in accordance with the teachings herein.

The present disclosure involves the use of additive manufacturing techniques to form a portion of a component "W", which portion will be referred to hereinafter as a "replacement body". The manufacture of replacement bodies and component repairs with such replacement bodies according to the present disclosure will be disclosed in the embodiments described below. In general terms, additive manufacturing techniques allow for the creation of a replacement body for a component "W" by building the replacement body with successively added layers; e.g., layers of powdered material. The additive manufacturing process facilitates manufacture of relatively complex replacement bodies. In the additive manufacturing process, one or more materials are deposited on a surface in a layer. In some instances, the layers are subsequently compacted. The material(s) of the layer may be subsequently unified using any one of a number of known processes (e.g., laser, electron beam, etc.). Typically, the deposition of the material (i.e. the geometry of the deposition layer for each of the materials) is computer controlled using a three-dimensional computer aided design (CAD) model. The three-dimensional (3D) model is converted into a plurality of slices, with each slice defining a cross section of the replacement body for a predetermined height (i.e. layer) of the 3D model. The additively manufactured replacement body is then "grown" layer by layer; e.g., a layer of powdered material(s) is deposited and then unified, and then the process is repeated for the next layer. Examples of additive manufacturing processes that can be used with the present disclosure include, but are not limited to, Stereolithography (SLS), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Direct Metal Laser Sintering (DMLS) and others. The present disclosure is not limited to using any particular type of additive manufacturing process.

Figure 6C:
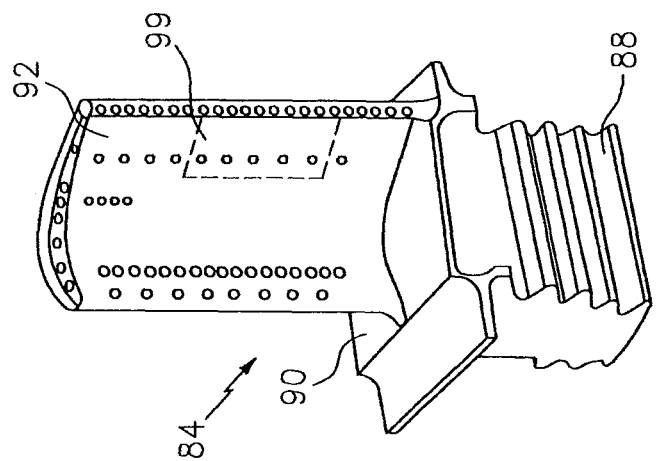
FIG. 6C is a diagrammatic perspective view of the turbine blade shown in FIG. 6A with a replacement body integrated into the blade.
Figure 6B:
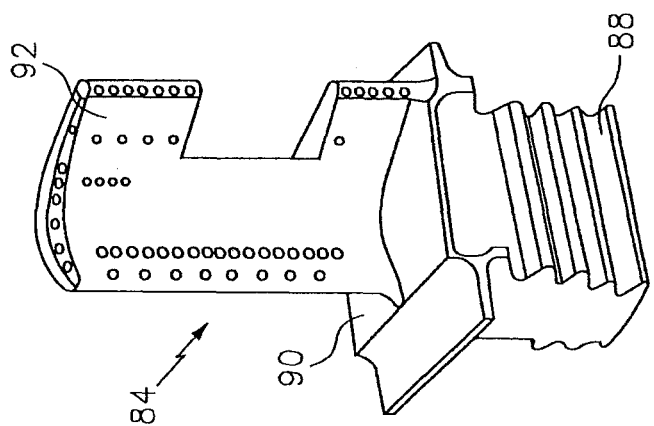
FIG. 6B is a diagrammatic perspective view of the turbine blade shown in FIG. 6A, showing a target section removed from the trailing edge.
Figure 6A:
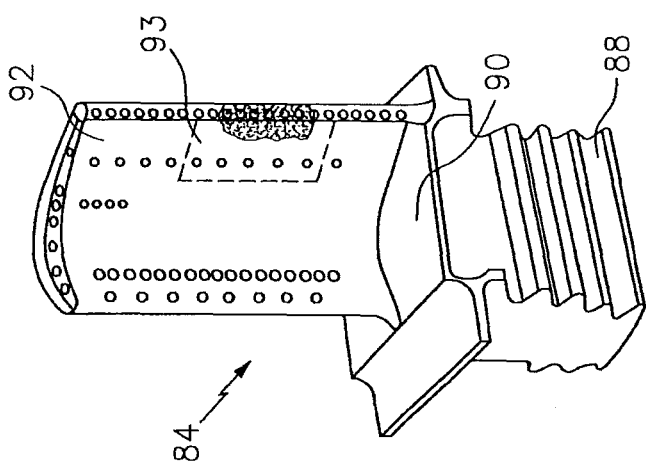
FIG. 6A is a diagrammatic perspective view of a turbine blade.

In the embodiments described below, an additive manufacturing process is for manufacturing a replacement body for a component "W". For purposes of illustrating the present disclosure, the component will be described and shown in terms of a turbine blade 84 and a replacement body 99 portion of the turbine blade 84. The present disclosure is not limited to this example. As can be seen in FIGS. 6A-6C and explained below, a target section 93 of blade (e.g., the dashed line portion containing damage shown in FIG. 6A) located at the trailing edge of the airfoil 92 portion of the blade is identified and removed (i.e., FIG. 6B diagrammatically shows the void remaining after target section 93 is removed). A replacement body 99 is produced according to the present disclosure, and is subsequently integrated (e.g., bonded) to the blade 84 in the void left upon removal of the target section 93 (e.g., shown in dashed lines in FIG. 6C). The descriptions below regarding the different embodiments for forming the replacement body 99 will, therefore, be shown in the Figures as a portion of the trailing edge of the blade airfoil. To further illustrate the present disclosure, a microcircuit cooling passage 144 that may be disposed in the wall of an airfoil is also discussed. An example of a microcircuit cooling passage is disclosed in U.S. Pat. No. 6,247,896, which patent is hereby incorporated by reference in its entirety.

Figure 7:
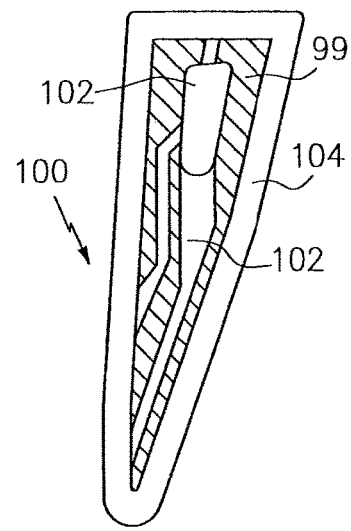
FIG. 7 is a diagrammatic lateral cross-section view of a replacement body with internal passages disposed within the crucible.
Figure 8:
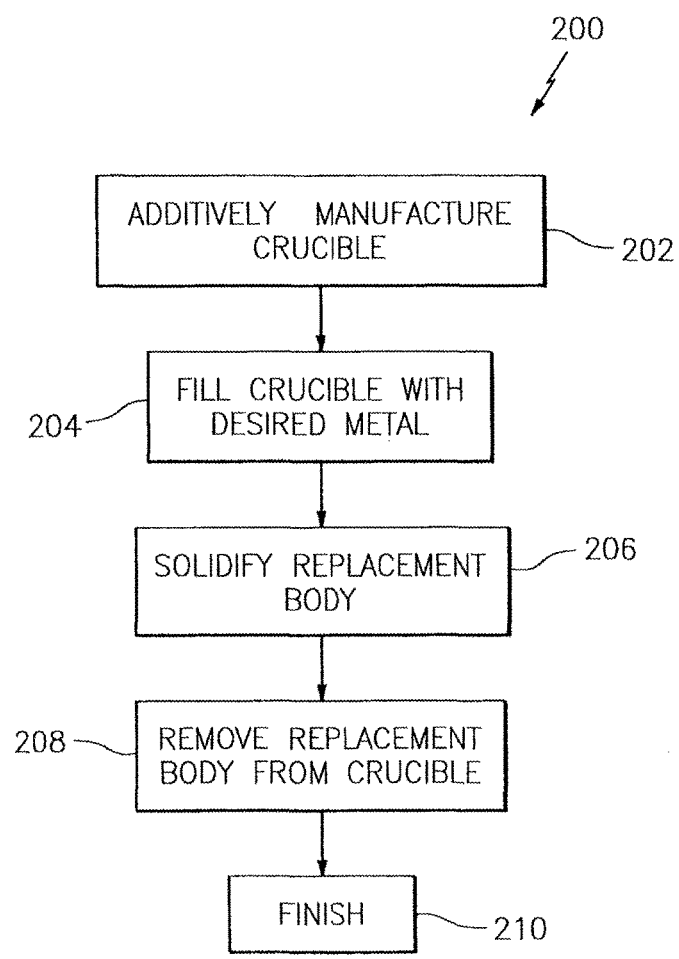
FIG. 8 is a flow chart of one disclosed non-limiting embodiment of a method for fabricating replacement body with internal passages.

Now referring to FIGS. 7 and 8, a replacement body 99 (e.g., a portion of a turbine blade trailing edge) is shown disposed within a crucible 100. The additive manufactured crucible 100 generally includes a core 102 and a shell 104. The shell 104 and the core 102 define the geometry of the replacement body 99, and provide a support structure for the replacement body 99 during formation. The shell 104 forms a structure having surfaces that will define outer surfaces of the replacement body 99. The core 102 forms solids that occupy volumes that will be voids (e.g., internal passages) within the final replacement body 99. In some instances, however, there may be no need for a core 102 when producing the replacement body 99. For example, if a component "W" has a damaged wall portion, and that wall portion has no internal void (e.g., no cooling passages, etc.), then the additively manufactured crucible may include only a shell 104 portion. In other instances, the replacement body may again be a wall portion but in this case the wall portion includes a plurality of cooling passages. Exemplary methods for creating such cooling passages according to the present disclosure are provided below. The crucible 100 may comprise a variety of different material types; e.g., refractory metals, ceramics, combinations thereof, etc. As will be explained below, the crucible 100 may be utilized as a melting unit and/or a die during processing of the replacement body.

With reference to FIG. 8, according to one disclosed non-limiting embodiment for forming single crystal superalloy component replacement body with internal passageways, a method includes forming a crucible 100. The crucible 100 is additively manufactured (Step 202). It should be appreciated that the core 102 and/or shell 104 of the crucible 100 may be additively manufactured from materials that include, but are not limited to, ceramic material such as silica, alumina, zircon, cobalt, mullite, kaolin, refractory metals, combinations thereof, etc.

Following additive manufacture, the crucible 100 may be dried and fired (i.e. bisqued) at an intermediate temperature before high firing to fully sinter and densification. The additively manufactured crucible 100 thereby forms a cavity for forming the replacement body. That is, the crucible 100 is integrally formed by the additive manufacturing process such that the conventional separate manufacture of the core and shell are essentially combined into a single step. It should be appreciated that single or multiple molds and cavities may be additively manufactured and assembled.

The crucible 100 may then be filled with a replacement body material such as a desired metal (Step 204). Non-limiting examples of replacement body materials include superalloys; e.g., nickel based superalloys, cobalt based superalloys, iron based superalloys, combinations thereof, etc. In some instances, the replacement body material added to the crucible 100 may be in powder form that can be subsequently melted. In other instances, the replacement body material added to the crucible 100 may be in molten form that is subsequently solidified. The present disclosure is not limited, however, to adding replacement body material in any particular form.

In some instances, the crucible is combined or utilized with structure (e.g., a starter seed and a chill plate) operable to cause the replacement body to be directionally solidified; e.g., formed to have a single crystal microstructure, a columnar grain microstructure, or other type of directionally solidified microstructure. A single crystal solid (sometimes referred to as a "monocrystalline solid") replacement body is one in which the crystal lattice of substantially all of the replacement body material is continuous and unbroken to the edges of the replacement body, with virtually no grain boundaries. Processes for growing a single crystal alloy microstructure or a columnar grain microstructure are believed to be known to those of ordinary skill in the art, and therefore descriptions of such processes are not necessary here for enablement purposes. However, an example is provided hereinafter to facilitate understanding of the present disclosure. A portion of a metallic starter seed may extend into a vertically lower portion of the replacement body material receiving portion of the crucible 100. During subsequent processing of the replacement body, molten component material contacts the starter seed and causes the partial melt back thereof. The replacement body material is subsequently solidified by a thermal gradient moving vertically through the crucible 100; e.g., the replacement body is directionally solidified from the unmelted portion of the starter seed to form the single crystal replacement body. The thermal gradient used to solidify the replacement body may be produced by a combination of mold heating and mold cooling; e.g., using a mold heater, a mold cooling cone, a chill plate and withdrawal of the component being formed. As indicated above, the aforesaid description is an example of how a replacement body may be formed with a single crystal microstructure, and the present disclosure is not limited thereto.

Now referring again to the embodiment described in FIGS. 7 and 8, a single crystal starter seed or grain selector may be utilized to create a replacement body 99 having a single crystal microstructure during solidification (Step 206). The solidification may utilize a chill block in a directional solidification furnace. The directional solidification furnace has a hot zone that may be induction heated and a cold zone separated by an isolation valve. The chill block and additively manufactured crucible 100 may be elevated into the hot zone and filled with molten super alloy. After the pour, or being molten, the chill plate may descend into the cold zone causing a solid/liquid interface to advance from the partially molten starter seed, creating the desired single crystal microstructure as the solid/liquid interface advances away from the starter seed. The formation process may be performed within an inert atmosphere or vacuum to preserve the purity of the replacement body material being formed.

Following solidification, the additively manufactured crucible 100 may be removed from the solidified replacement body 99 by various techniques (e.g., caustic leaching), thereby leaving behind the finished single crystal replacement body 99 (Step 208). After removal, the replacement body 99 may be further finished such as by machining, threading, surface treating, coating or any other desirable finishing operation (Step 210).

Figure 10:
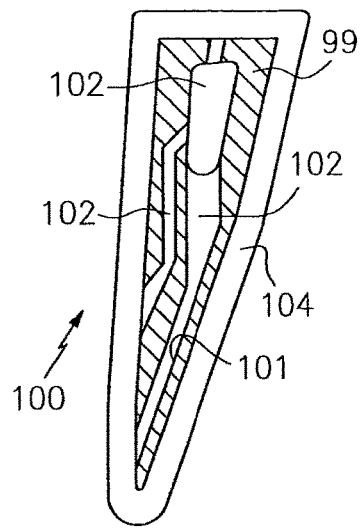
FIG. 10 is a diagrammatic lateral cross-section view of a replacement body with internal passages disposed within the crucible.
Figure 9:
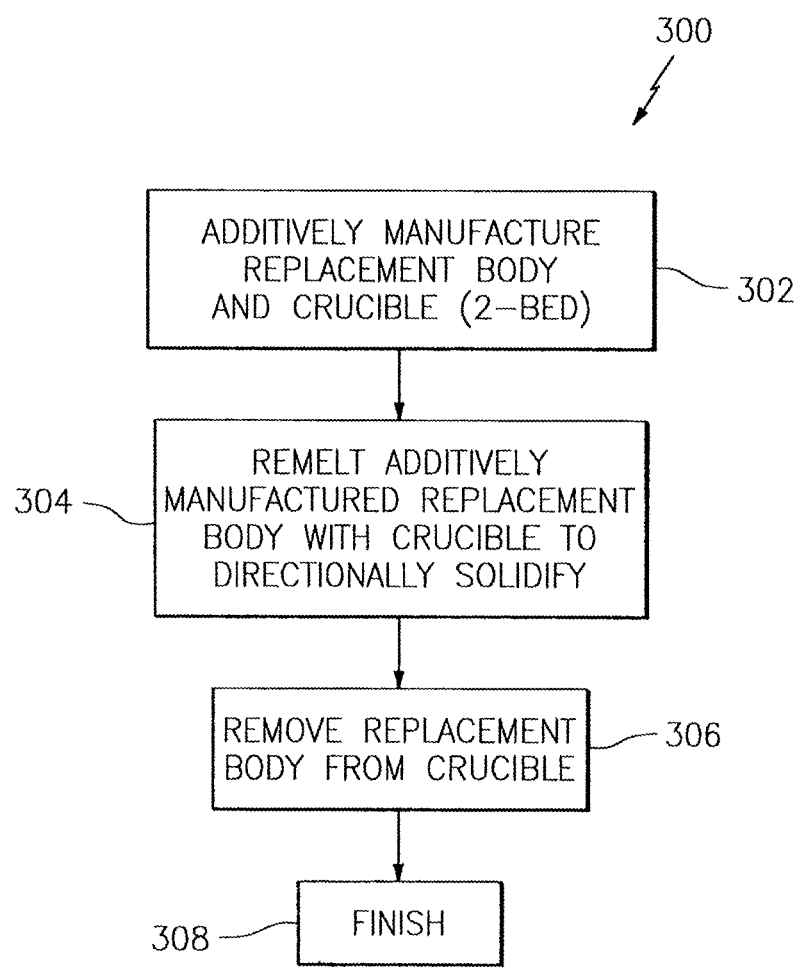
FIG. 9 is a flow chart of one disclosed non-limiting embodiment of a method for fabricating replacement body with internal passages.

Now referring to FIGS. 9 and 10, in another non-limiting embodiment a method 300 includes additively manufacturing a replacement body 99 for a component "W" (e.g. a turbine blade, vane, etc.) and a crucible 100. The replacement body 99 includes internal cooling passages 101 (Step 302). In this embodiment, the replacement body 99 and the crucible 100 are additively manufactured using a multi-feedstock process such as a two-powder bed system. The replacement body is manufactured of the desired superalloy, while the core 102 and shell 104 of the crucible 100 are manufactured of a different material such as a ceramic, a refractory metal, or other material which is later removed. With respect to the internal cooling passages within the replacement body, during the additive manufacturing process, a ceramic material, a refractory metal material, or other core 102 material is deposited at the locations within the layers of the additively formed structure to coincide with the locations of the voids that will form the passages within the replacement body. The core 102 within the replacement body and the shell 104 that surrounds the replacement body are later removed; e.g., in a manner as described above.

The replacement body, being additively manufactured, may be a polycrystalline superalloy. As indicated above, it may be desirable for the replacement body to have a single crystal microstructure (or a columnar grain microstructure) that is better suited to withstand the high temperature, high stress operating environment of the gas turbine engine.

To thereby facilitate formation of a replacement body having a single crystal microstructure, the additively manufactured superalloy replacement body is re-melted within the crucible 100 (Step 304). For example, the additively manufactured superalloy replacement body may be re-melted and directionally solidified (e.g., as described above) to form a metal single crystal microstructure within the crucible 100. As indicated above, the present disclosure is not limited to any particular technique for creating the single crystal microstructure.

Following solidification, the additively manufactured crucible 100 may be removed from the solidified replacement body by various known techniques (e.g., caustic leaching), to leave the finished single crystal component (Step 306). After removal, the replacement body may be further finished such as by machining, threading, surface treating, coating or any other desirable finishing operation (Step 308).

Figure 12:
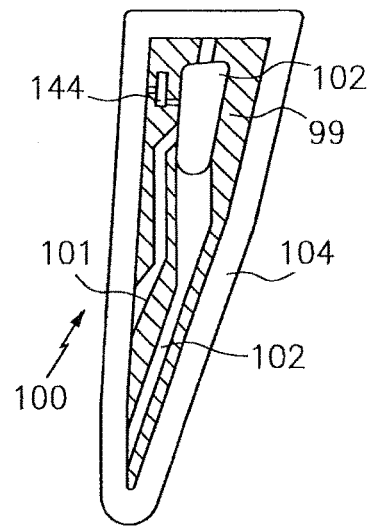
FIG. 12 is a diagrammatic lateral cross-section view of a replacement body with internal passages and a microcircuit passage disposed within the crucible.
Figure 11:
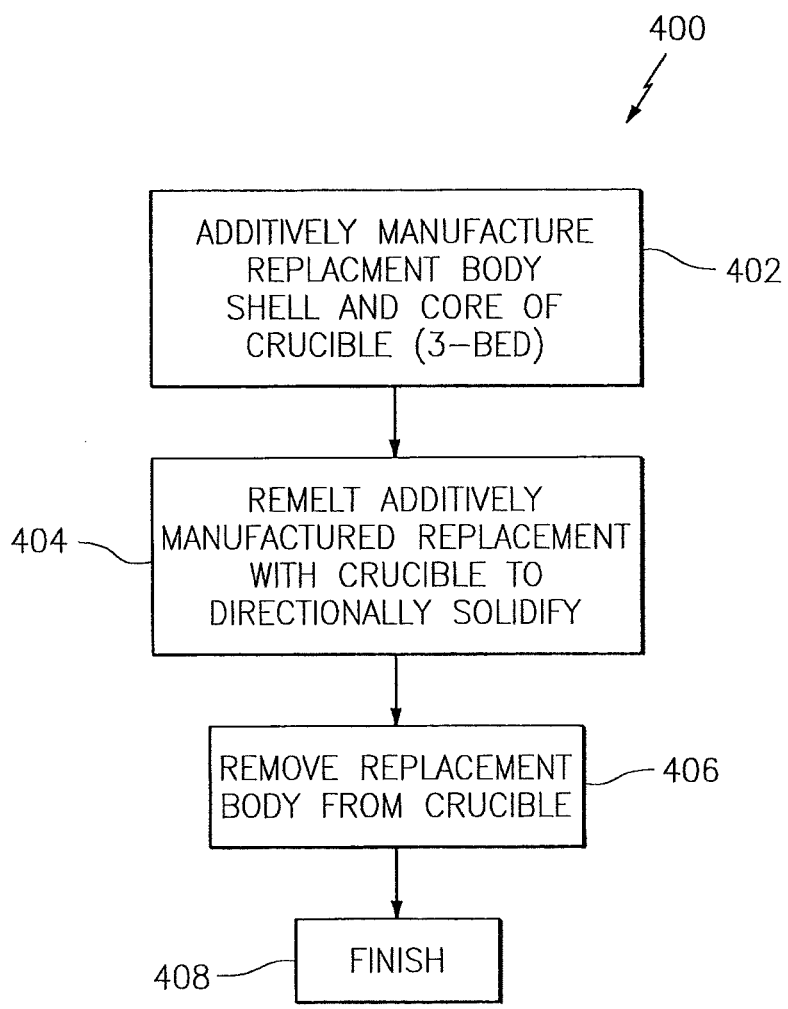
FIG. 11 is a flow chart of another disclosed non-limiting embodiment of a method for fabricating a replacement body with internal passages.
Figure 13:
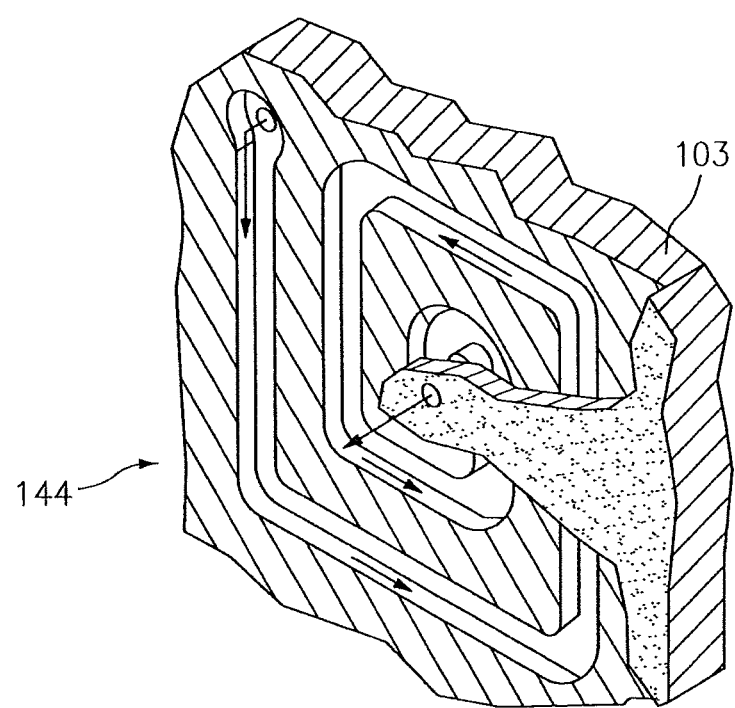
FIG. 13 is a diagrammatic perspective sectional view of a microcircuit cooling passage disposed within an airfoil wall.

Now referring to FIGS. 11-13, a method 400 according to another non-limiting embodiment includes additively manufacturing the replacement body with a multi-feedstock additive manufacturing process such as three-powder bed system (Step 402). The replacement body is manufactured of the desired superalloy while the core 102 and shell 104 of the crucible 100 are manufactured of a different material (FIG. 12). During the additive manufacturing process, a ceramic material is deposited at the locations within the layers of the additively formed structure to coincide with the locations of the voids that will form the internal cooling passages within the replacement body, and a refractory metal material is deposited at the locations within the layers of the additively formed structure to coincide with the locations of the voids that will form microcircuits 144 (see FIG. 13) within the replacement body. As indicated above, microcircuit cooling passages 144 may be disposed in the wall 103 of an airfoil. FIG. 13 illustrates an example of a microcircuit cooling passage, which microcircuit passage is shown schematically disposed in the wall portion of the replacement body shown in FIG. 12. The microcircuit(s) 144 is relatively smaller than, and may be located outboard of, the internal cooling passages 101 to facilitate tailorable, high efficiency convective cooling. Examples of refractory metal materials that can be additively deposited to form the microcircuits include, but are not limited to, molybdenum (Mo) and Tungsten (W), both of which possess relatively high ductility for formation into complex shapes and have melting points that are in excess of typical casting temperatures of nickel based superalloys. Refractory metals of this type can be removed by various known techniques (e.g., chemical removal, thermal leaching, oxidation methods, etc.) to leave behind the microcircuit 144 cavity.

As described above, to facilitate formation of a replacement body having a single crystal microstructure, the additively manufactured replacement body is re-melted within the crucible 100 (Step 404) formed in step 402, and subjected to processes for creating the single crystal microstructure (or columnar grain microstructure) within the replacement body 99. As indicated above, the present disclosure is not limited to any particular technique for creating the single crystal replacement body.

Following solidification, the additively manufactured crucible 100 may be removed from the solidified replacement body by various known techniques (e.g., caustic leaching) to leave the finished single crystal replacement body 99 (Step 406). After removal, the replacement body may be further finished such as by machining, threading, surface treating, coating or any other desirable finishing operation (Step 408).

Figure 15:
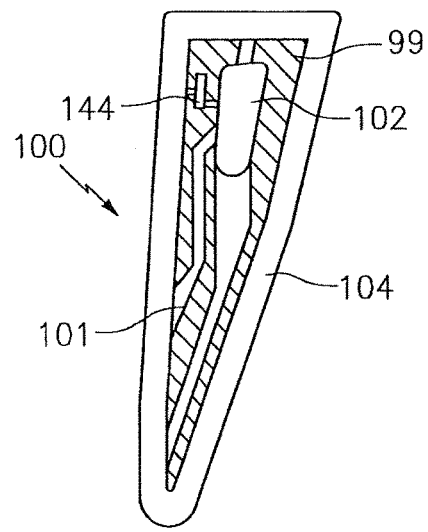
FIG. 15 is a diagrammatic perspective sectional view of a replacement body including internal passages and a microcircuit cooling passage disposed within an airfoil wall.
Figure 14:
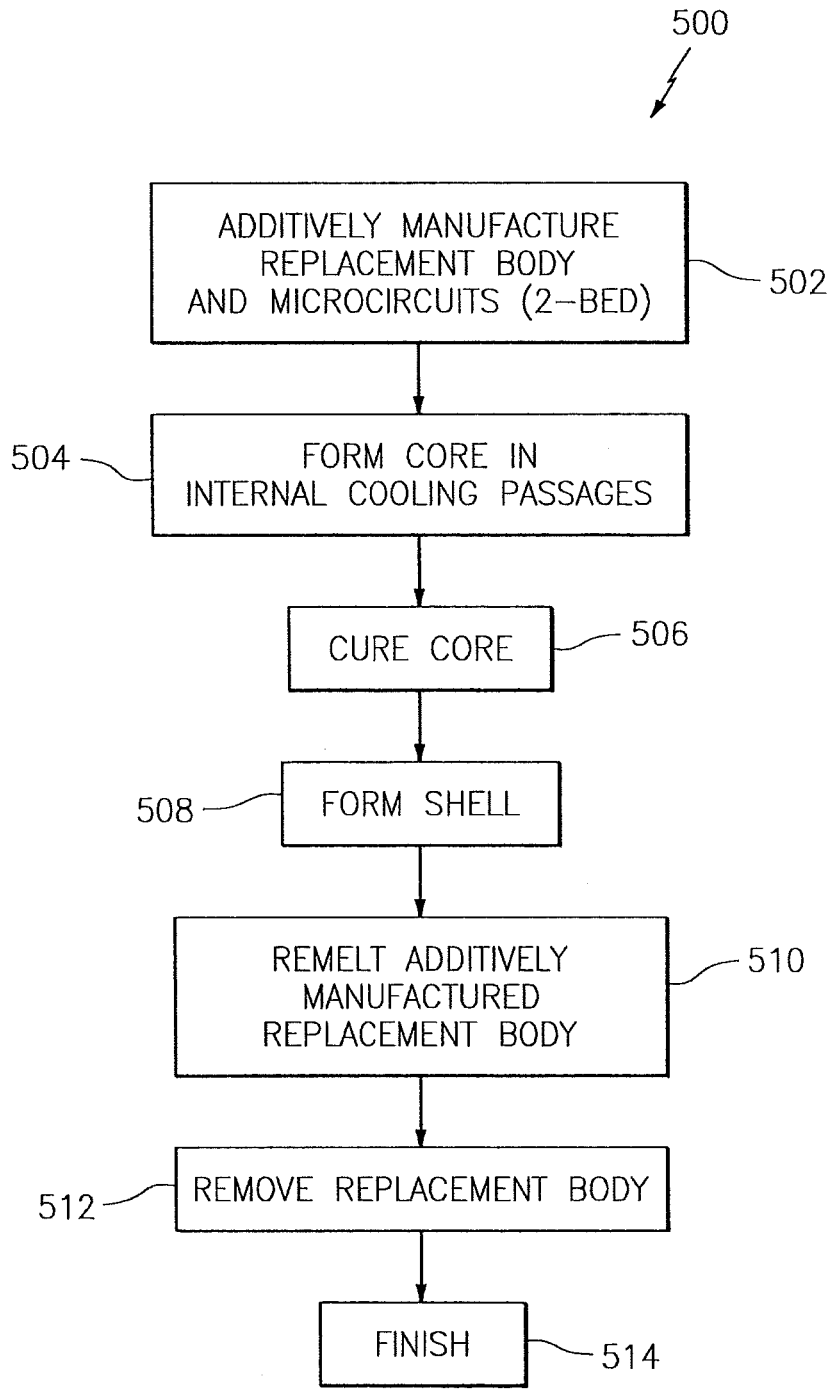
FIG. 14 is a flow chart of another disclosed non-limiting embodiment of a method for fabricating component replacement body with internal passages.

Now referring to FIGS. 14 and 15, a method 500 according to another disclosed non-limiting embodiment includes additively manufacturing a replacement body with a multi-feedstock additive manufacturing process such as two-powder bed system (Step 502). During the additive manufacturing process, a desired superalloy material is deposited in layers to form the replacement body structure, and a refractory metal material is additively deposited at locations within the layers of the additively formed structure to coincide with the locations of the voids that will form the microcircuits 144 (see also FIG. 13) within the replacement body 99.

In this embodiment, the internal cooling passages 101 of the replacement body may be filled with ceramic slurry to form the core 102 (Step 504). The slurry may include, but is not limited to, ceramic materials commonly used as core materials including, but not limited to, silica, alumina, zircon, cobalt, mullite, and kaolin. In the next step, the ceramic core may be cured in situ by a suitable thermal process if necessary (Step 506).

Next, a ceramic shell 104 may then be formed over the replacement body and internal ceramic core (Step 508). The ceramic shell may be formed over the replacement body and ceramic core by dipping the combined replacement body and ceramic core into a ceramic powder and binder slurry to form a layer of ceramic material covering the replacement body and core. The slurry layer is dried and the process repeated for as many times as necessary to form a green (i.e. unfired) ceramic shell mold. The thickness of the green ceramic shell mold at this step may be from about 0.2-1.3 inches (5-32 mm) The green shell mold may then be bisque fired at an intermediate temperature to partially sinter the ceramic and burn off the binder material. The mold may then be high fired at a temperature between about 1200° F. (649° C.) to about 1800° F. (982° C.) from about 10 to about 120 minutes to sinter the ceramic to full density to form the shell mold.

As described above, to facilitate formation of a replacement body 99 having a single crystal microstructure, the additively manufactured component is re-melted within the crucible 100 (Step 510), and subjected to processes for creating the single crystal microstructure (or columnar grain microstructure) within the replacement body. As indicated above, the present disclosure is not limited to any particular technique for creating the single crystal microstructure.

Following solidification, the additively manufactured crucible 100 may be removed from the solidified replacement body by known techniques (e.g., caustic leaching, etc.), to leave the finished single crystal replacement body 99 (Step 512). After removal, the replacement body 99 may be further finished such as by machining, threading, surface treating, coating or any other desirable finishing operation (Step 514).

Figure 16:
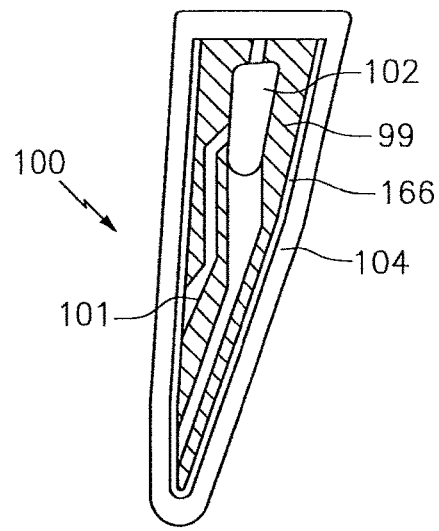
FIG. 16 is a flow chart of another disclosed non-limiting embodiment of a method for fabricating component replacement body with internal passages.
Figure 17:
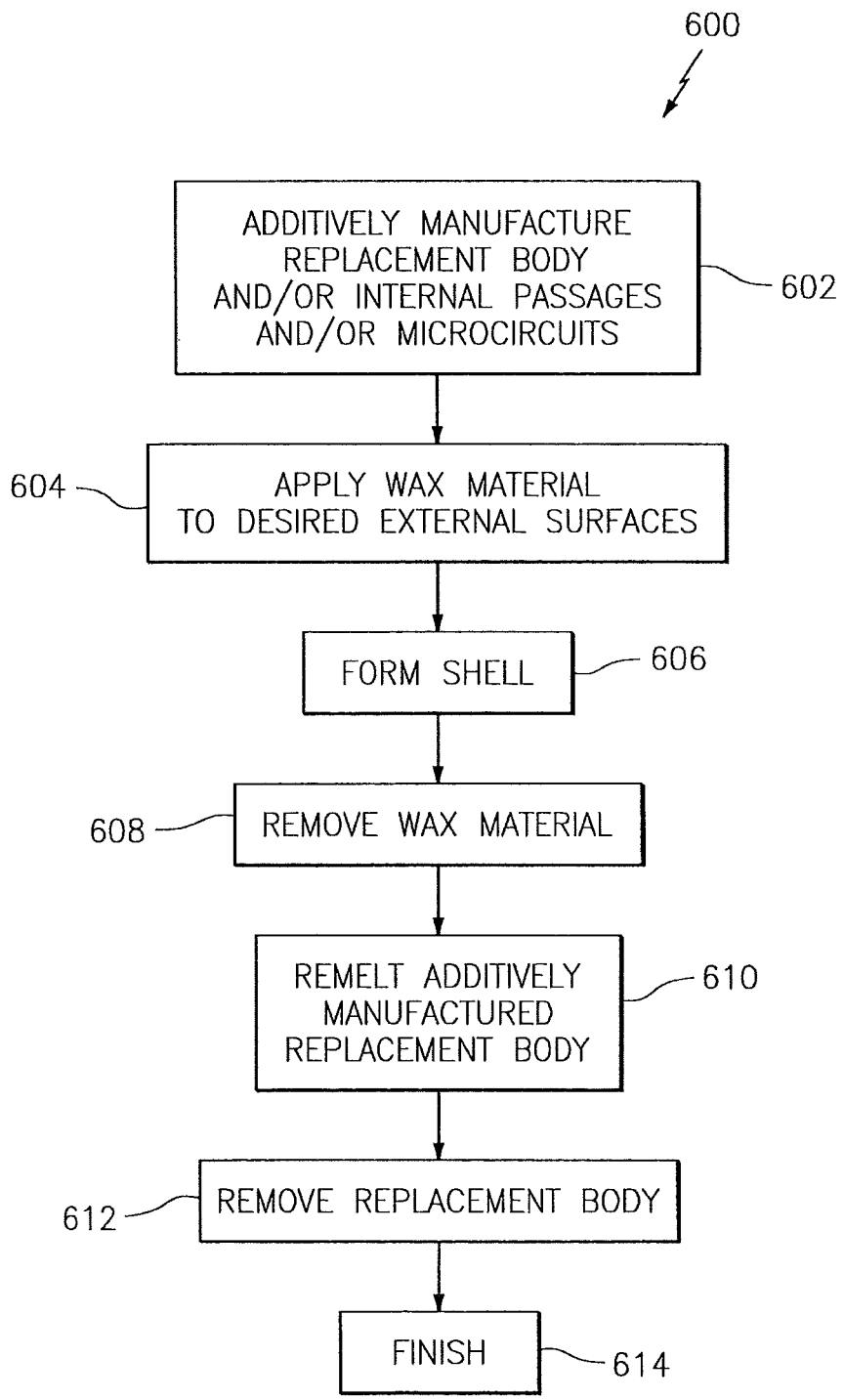
FIG. 17 is a diagrammatic perspective sectional view of a replacement body having a microcircuit cooling passage disposed within an airfoil wall.

Now referring to FIGS. 16 and 17, a method 600 according to another disclosed non-limiting embodiment facilitates a high quality surface finish. As described above, the replacement body is additively manufactured of a desired superalloy that itself forms the cavity pattern for the crucible. The additively manufactured replacement body is then re-melted within the crucible to facilitate formation of the single crystal microstructure. However, the crucible, being formed by the additive manufactured structure, may have a relatively rough surface finish typically not acceptable for use as a blade or vane in the gas turbine engine; e.g., blade/vane airfoil surfaces typically require relatively tight contour tolerances and smooth surface finishes that may not be achievable by direct additive manufacture within a reasonable cycle time.

To further improve the finish of an exterior surface of a replacement body 99 (additively manufactured according to any of the above-described embodiments), a relatively thin layer of a wax material 166 may be applied to an external, aerodynamic surface (e.g. an airfoil surface) of the replacement body 99 (Step 604; FIG. 17). The wax material provides a smoother surface finish than the relatively rough surface of an additively manufactured replacement body 99.

Next, a ceramic shell 104 is formed over the replacement body 99 (Step 606). The ceramic shell may be formed over the additively manufactured body 99 by dipping or other process.

The relatively thin layer of a wax material 166 is subsequently removed (Step 608). The relatively thin layer of a wax material 166 may be removed by heating or other operation that does not otherwise affect the additively manufactured replacement body 99.

Then, as described above, to facilitate formation of the single crystal microstructure (or columnar grain microstructure) the additively manufactured superalloy replacement body 99 is re-melted within the shell of the crucible (Step 610), and subjected to processes for creating the single crystal microstructure within the replacement body 99. As indicated above, the present disclosure is not limited to any particular technique for creating the single crystal microstructure. It should be further appreciated that the re-melting (Step 610) may alternatively be combined with the removal of the relatively thin layer of a wax material 166 (Step 608).

Following solidification, the solidified replacement body may be removed from the crucible by known technique (e.g., caustic leaching), to leave the finished single crystal replacement body 99 (Step 612). After removal, the replacement body may be further finished such as by machining, threading, surface treating, coating or any other desirable finishing operation (Step 614).

Figure 18:
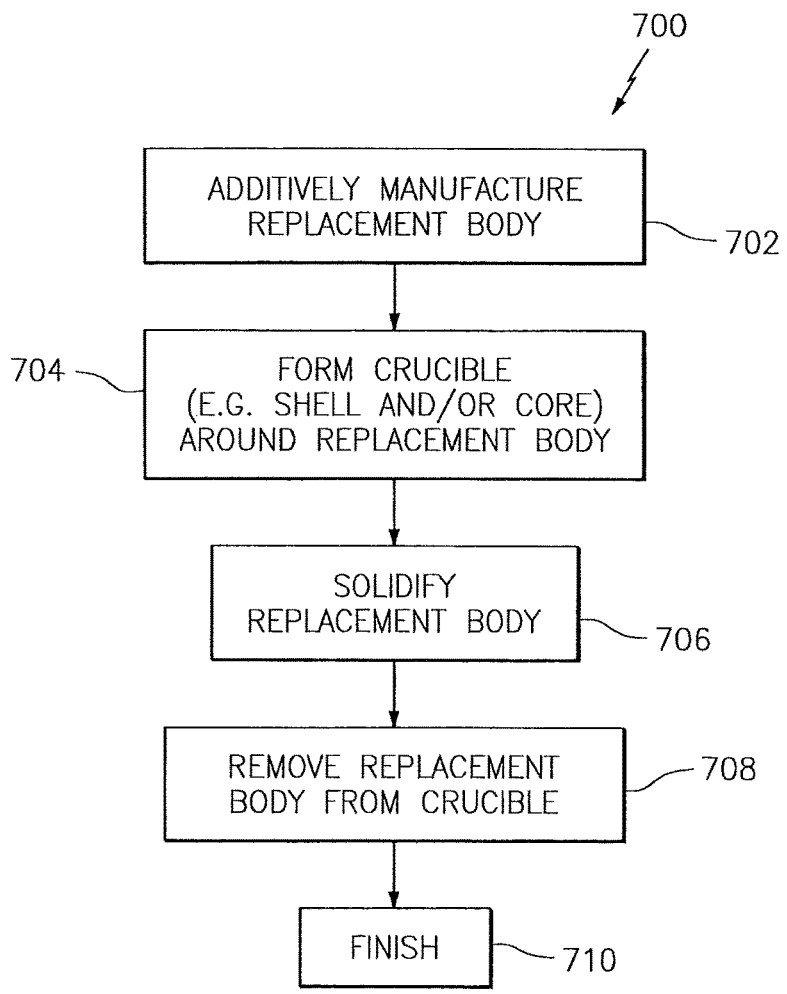
FIG. 18 is a flow chart of another disclosed non-limiting embodiment of a method for fabricating an example component with internal passages.
Figure 19:
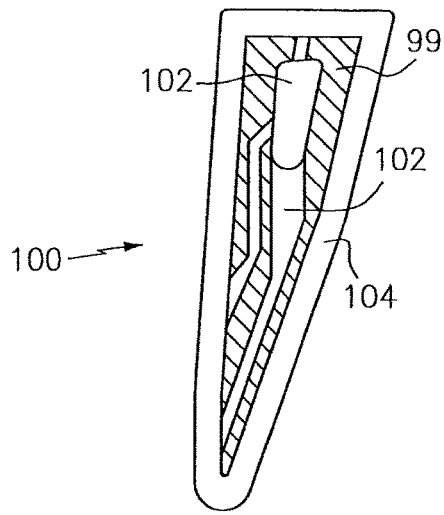
FIG. 19 is a diagrammatic perspective sectional view of a microcircuit cooling passage disposed within an airfoil wall.

Now referring to FIGS. 18 and 19, a method 700 according to another disclosed non-limiting embodiment is provided that includes additively manufacturing the replacement body 99 of a desired superalloy (Step 702). Next, a core 102 is formed within the replacement body 99, or a ceramic shell 104 is formed over the replacement body 99, or both (Step 704). The ceramic core 102 and/or ceramic shell 104 may be formed over the additively manufactured replacement body 99 by dipping or other process.

Then, as described above, to facilitate formation of the single crystal microstructure (or columnar grain microstructure) in the additively manufactured superalloy replacement body 99, the body is re-melted within the shell of the crucible (Step 706), and subjected to processes for creating the directionally solidified microstructure within the replacement body 99. As indicated above, the present disclosure is not limited to any particular technique for creating the directionally solidified (e.g., single crystal microstructure, columnar grain microstructure, etc.).

Following solidification, the solidified replacement body 99 may be removed from the crucible by known technique (e.g., caustic leaching), to leave the finished single crystal replacement body 99 (Step 708). After removal, the replacement body may be further finished such as by machining, threading, surface treating, coating or any other desirable finishing operation. After removal, the replacement body 99 may be further finished such as by machining, threading, surface treating, coating or any other desirable finishing operation (Step 710).

Figure 20:
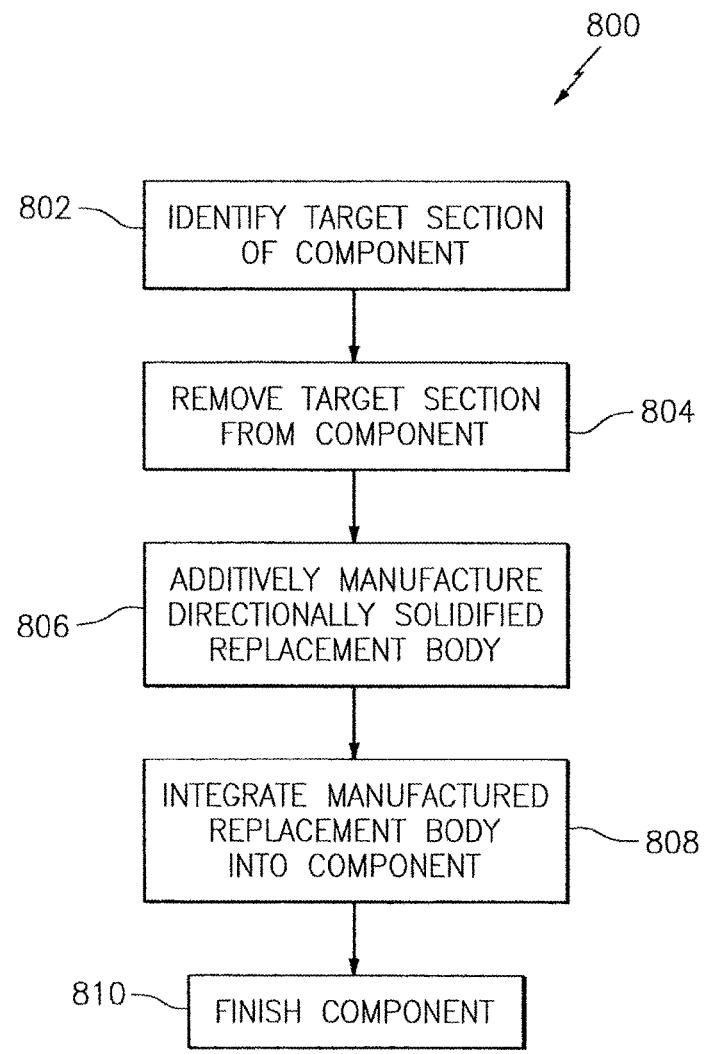
FIG. 20 is a flow chart of another disclosed non-limiting embodiment of a method for repairing or modifying a component with a replacement body, which replacement body is additively manufactured with a directionally solidified microstructure.

Now referring to FIG. 20, in the method 800 for the repair or modification of a component of a gas turbine, a particular section of the component of the gas turbine that is to be repaired or modified (the aforesaid section is referred to herein as the "target section" 93) is identified (Step 802), and this target section is removed; e.g., cut out (Step 804). A data record may be generated for a replacement body 99 that is to be produced. The replacement body 99 is subsequently produced using the above described additive manufacturing techniques (Step 806). Thereafter, the replacement body 99 is integrated into the component that is to be repaired or modified (Step 808). Accordingly, the method includes removing the target section of the component (e.g., cutting it out), additively producing a corresponding replacement body, and subsequently bonding the replacement body to the component (Step 810). After the replacement body 99 is bonded to the component, the component may be further finished such as by machining, threading, surface treating, coating or any other desirable finishing operation (Step 812).

The target section 93 of the component may be removed using a variety of known techniques for material removal. The present method is not limited to any particular technique. The term "target section" as used herein, refers to a portion of the component that includes characteristics (e.g., mechanical characteristics, aerodynamic characteristics, etc.) that the user has identified for replacement. Non-limiting examples of such characteristics include cracks, regions compromised by erosion or oxidation, etc., but could also include areas that have not specifically been subject to damage, but rather may be an area that the user has identified for modification (e.g., improved cooling or aerodynamic characteristics, or mechanical strength characteristics, etc.). As indicated above, the target section includes characteristics that the user has identified for replacement, but also may extend beyond the regions containing those characteristics. For example, in some instances the target section may be sized to extend outside the region containing the identified characteristics to provide a buffer region to ensure all aspects of the characteristics are addressed. In other instances, it may be beneficial to adopt a uniform target section sizing for a given component; e.g., in instances where a given component often experiences damage in a particular region, a repair can be facilitated by adopting uniformly sized target sections and corresponding uniformly sized replacement bodies.

Once the target section is removed from the component, the component may be analyzed using a measuring device (e.g., a multi-dimensional mechanical or optical probe) to accurately determine the geometry of the void left after the target section was removed. This analysis may include an inspection of some, or all, of the component to evaluate the component for deformation and the like; e.g., aspects that may be unique to the particular component as a result of its previous service life and/or original manufacturing. Dimensional measurements made by measuring device can subsequently be stored in a format such as a 3D CAD data file. In the case of a uniquely sized target section, this 3D CAD data file can be used in the generation of the replacement body. In the case of a process that utilizes a uniformly sized target section, the 3D CAD data file can be used to ensure the removal of the uniform target section was correctly performed, dimensionally speaking.

The 3D CAD data file representative of the void left by the removal of the target section can be used alone or in combination with a 3D CAD data file representing the replacement body to be inserted into the void during the additive manufacturing of the replacement body. The replacement body 3D CAD data file may represent the component as originally manufactured, or may represent the component in an enhanced configuration; e.g., improved cooling passage configurations, etc. The 3D CAD data file can then be used to create an appropriate 3D CAD data file for controlling the machinery used to additively manufacture the replacement body; i.e., the replacement body itself, and the core 102 and shell 104 as applicable.

As indicated above, after the replacement body is additively produced, but before the integration of the replacement body into the component "W", it may be desirable to subject the replacement body to various different manufacturing processes; e.g., processes that clean the replacement body, improve the surface quality of the replacement body, optimize the mechanical-technological properties of the replacement body, etc.

Once the replacement body is in form for integration into the component "W", the replacement body is then installed within the void left by the removal of the target section and bonded to the component "W". Bonding methods such as laser welding, Gas tungsten arc welding (GTAW), Electron beam welding (EBW), soldering, transition liquid phase bonding, combinations thereof, etc., may be used, and the present disclosure is not limited to any particular bonding process. After the replacement body is bonded in place, it may be necessary to subject the component to further manufacturing techniques (e.g., heat treatment, surface treatment, coatings, etc.) to place the component "W" in finished form.

The method disclosed herein facilitates the relatively rapid additive manufacture of single crystal microstructure replacement bodies with complex internal passages and heretofore unavailable surface finishes for accommodating the high temperature, high stress operating environment of a gas turbine engine environment.

It should be understood that relative positional terms such as "forward," "aft," "upper," "lower," "above," "below," and the like are with reference to the normal operational attitude of the vehicle and should not be considered otherwise limiting.

It should be understood that like reference numerals identify corresponding or similar elements throughout the several drawings. It should also be understood that although a particular component arrangement is disclosed in the illustrated embodiment, other arrangements will benefit here from.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method of manufacturing a replacement body for a component, comprising:
    additively manufacturing the replacement body with a material;
    melting the additively manufactured replacement body; and
    solidifying the material of the additively manufactured replacement body to fault a directionally solidified microstructure within the component.

2. The method of claim 1, further comprising:
    forming a core at least partially within the replacement body.

3. The method of claim 2, further comprising:
    at least partially encasing the replacement body and the core within a shell.

4. The method of claim 2, further comprising:
    removing a shell and the core to reveal the directionally solidified microstructure replacement body.

5. The method of claim 2, wherein the forming of the core includes additively manufacturing the core.

6. The method of claim 1, wherein the solidifying of the material includes directionally solidifying the material to have a single crystal microstructure.

7. The method of claim 1, wherein the solidifying of the material includes directionally solidifying the material to have a columnar grain microstructure.

8. The method of claim 2, wherein the core at least partially defines at least one internal passageway within the replacement body.

9. The method of claim 8, further comprising concurrently additively manufacturing the replacement body and the core within the replacement body.

10. The method of claim 8, wherein the core at least partially defines at least one microchannel within the replacement body.

11. The method of claim 10, wherein the microchannel is additively manufactured of a refractory material and the internal passageway is additively manufactured of a ceramic material.

12. The method of claim 11, wherein the additive manufacturing is performed by a multi-powder bed system.

13. The method of claim 1, further comprising applying a wax material at least partially onto the replacement body.

14. A method of manufacturing a replacement body for a component, comprising:
    additively manufacturing a replacement body from a material; and
    melting and solidifying the replacement body within a crucible to form a directionally solidified microstructure within the replacement body.

15. The method of claim 14, further comprising:
    forming the crucible around the replacement body.

16. The method of claim 14, further comprising:
    removing the crucible from the directionally solidified replacement body.

17. The method of claim 14, wherein the solidifying of the replacement body includes directionally solidifying the material of the replacement body to have a single crystal microstructure.

18. The method of claim 14, wherein the solidifying of the replacement body includes directionally solidifying the material of the replacement body to have a columnar grain microstructure.

19. The method of claim 14, wherein the material is selected from the group consisting of a nickel based superalloy, cobalt based superalloy, iron based superalloy, and mixtures thereof.

20. The method of claim 15, wherein the crucible is formed from a ceramic material slurry.

* * * * *

UNITED STATES PATENT AND TRADEMARK OFFICE
CERTIFICATE OF CORRECTION

PATENT NO. : 9,770,758 B2  
APPLICATION NO. : 15/219921  
DATED : September 26, 2017  
INVENTOR(S) : JinQuan Xu It is certified that error appears in the above-identified patent and that said Letters Patent is hereby corrected as shown below:

In the Claims

Column 13, Line 62, Claim 1 please delete "fault" and insert --form--

Signed and Sealed this  
Seventh Day of November, 2017

Joseph Matal  
*Performing the Functions and Duties of the*  
*Under Secretary of Commerce for Intellectual Property and*  
*Director of the United States Patent and Trademark Office*